United States Patent [19]
Yeh

[11] Patent Number: 5,995,814
[45] Date of Patent: Nov. 30, 1999

[54] SINGLE-STAGE DUAL-BAND LOW-NOISE AMPLIFIER FOR USE IN A WIRELESS COMMUNICATION SYSTEM RECEIVER

[75] Inventor: Hsi-Jen James Yeh, New York, N.Y.

[73] Assignee: Lucent Technologies Inc., Murray Hill, N.J.

[21] Appl. No.: 08/874,892

[22] Filed: Jun. 13, 1997

[51] Int. Cl.[6] .................................................. H04Q 7/20
[52] U.S. Cl. ...................................... 455/180.1; 455/553
[58] Field of Search ........................... 455/178.1, 180.1, 455/180.2, 553, 180.4, 552; 334/15, 55

[56] References Cited

U.S. PATENT DOCUMENTS

| | | | |
|---|---|---|---|
| 3,611,154 | 10/1971 | Kupfer | 455/180.1 |
| 3,624,514 | 11/1971 | Putzer | 455/180.4 |
| 4,247,953 | 1/1981 | Shinagawa et al. | 455/180.2 |
| 4,823,094 | 4/1989 | Reiffin | 330/263 |
| 5,045,808 | 9/1991 | Taylor | 330/227 |
| 5,402,138 | 3/1995 | Hulett et al. | 343/840 |
| 5,406,226 | 4/1995 | Cioffi et al. | 330/302 |
| 5,423,078 | 6/1995 | Epperson et al. | 455/553 |
| 5,448,255 | 9/1995 | Hulett et al. | 343/840 |
| 5,457,734 | 10/1995 | Eryaman et al. | 455/422 |
| 5,491,449 | 2/1996 | Johnson et al. | 330/269 |
| 5,774,017 | 6/1998 | Adar | 330/126 |

*Primary Examiner*—Dwayne D. Bost
*Assistant Examiner*—Myron K. Wyche

[57] ABSTRACT

A low-noise amplifier capable of operation in two or more frequency bands of a personal communication services (PCS) receiver or other wireless communication system terminal. An exemplary embodiment of the amplifier includes a single bipolar junction transistor amplification stage. Input and output matching networks for the transistor each include a first series capacitor, a shunt inductor coupled to ground potential, a second series capacitor and a second inductor coupled to a supply voltage. These four elements are used to provide narrowband input or output matches in two distinct frequency bands, such as 900 MHz and 1.8 GHz. The first series capacitors in the input and output matching networks may also be used to provide DC input and output isolation, respectively, and the second inductors of the input and output matching networks may be used to supply DC bias to the base and collector, respectively, of the amplifier transistor. The matching networks may be configured using only lumped inductive and capacitive elements, with values limited to less than about 10 nH and 10 pF, respectively. The amplifier may be configured to provide a minimum gain of 15 dB and a maximum noise figure of 2 dB over 100 MHz-wide bands centered at 900 MHz and 1.8 GHz.

30 Claims, 7 Drawing Sheets

FREQUENCY 900.0 TO 900.0 MHz

FIG. 4

FREQUENCY 1800.0 TO 1800.0 MHz

SINGLE-STAGE DUAL-BAND LOW-NOISE AMPLIFIER FOR USE IN A WIRELESS COMMUNICATION SYSTEM RECEIVER

FIELD OF THE INVENTION

The present invention relates generally to electronic circuits for use in wireless communication systems, and more particularly to a low-noise amplifier which is capable of operation in multiple frequency bands, such as the 900 MHz and 1.8 GHz bands of a personal communication services (PCS) wireless system.

BACKGROUND OF THE INVENTION

Demand for cellular telephones and other wireless communications services is continually increasing. As a result, many wireless systems are now configured to operate in more than one frequency band. For example, a cellular system described in U.S. Pat. No. 5,457,734, which issued Oct. 10, 1995 to Eryaman et al. and is entitled "Multi-Band Cellular Radiotelephone System Architecture" is capable of simultaneous operation in two distinct frequency bands centered at 800 MHz and 1.5 GHz. In addition, personal communication services (PCS) wireless systems have recently been configured using a first band centered at 900 MHz and a second band centered at 1.8 GHz. These and other multiple-band wireless communication systems have created a demand for handsets and other types of portable communication terminals that are capable of operating in two or more distinct frequency bands.

In order to minimize the cost and complexity of the front end radio-frequency (RF) circuitry in these multi-band portable terminals, it would be highly desirable to provide a single low-noise amplifier at the front end that can, for example, amplify both the 900 MHz and 1.8 GHz frequency bands. Such an amplifier should have both a low noise figure and a high gain to reduce the effects of noise in subsequent amplifying stages. Unfortunately, conventional low-noise amplifiers are unable to provide acceptable noise and gain performance in multiple wireless bands without unduly increasing the amplifier cost and complexity. For example, application of conventional matching techniques to a low-noise amplifier would generally require that both an input and an output matching network utilize a separate set of at least two or three elements for each of the frequency bands to be matched. A separate set of elements is therefore used to provide a narrowband input or output match for each of the frequency bands. Other conventional approaches may attempt to use a single set of elements to provide a broadband input or output match, but such techniques are very difficult to implement and often unable to meet the performance requirements of multiple frequency bands. As a result of these and other deficiencies of the prior art, it may be necessary for a given handset to include separate amplifiers for each of the frequency bands, or a single, multi-stage amplifier which is both complex and expensive. In either case, the size, cost and power consumption of the handset is unduly increased.

It is therefore apparent that a need exists for a simple and inexpensive low-noise amplifier which can operate in at least two distinct frequency bands, such that the amplifier may be used in a handset or other portable communication terminal of a multi-band wireless system without unduly increasing the size, cost and power consumption of the portable terminal.

SUMMARY OF THE INVENTION

The present invention provides a simple and inexpensive low-noise amplifier which can provide excellent performance in two or more frequency bands. In accordance with the invention, input and output matching networks are used to provide respective input and output matches for the amplifier in two distinct frequency bands. Unlike conventional matching networks, the input and output matching networks of the present invention each utilize a single set of elements to provide two narrowband matches in two distinct frequency bands. As a result, the complexity of the amplifier is significantly reduced, while its gain and noise figure performance is improved.

An illustrative embodiment of the invention is a low-noise amplifier capable of operation in the 900 MHz and 1.8 GHz frequency bands of a personal communication services (PCS) receiver or other wireless communication system terminal. The amplifier includes a single bipolar junction transistor amplification stage having a gain-bandwidth frequency $f_T$ of only about 10 GHz. The input and output matching networks for the transistor each include a first series capacitor, a shunt inductor coupled to ground potential, a second series capacitor, and a second inductor coupled to a supply voltage. These four elements are used to provide narrowband input or output matches in both the 900 MHz and 1.8 GHz frequency bands. The matching networks also serve to suppress gain outside of the 900 MHz and 1.8 GHz frequency bands. The invention further reduces amplifier circuit complexity by utilizing the first series capacitors in the input and output matching networks to provide respective DC input and output isolation, and by utilizing the second inductors of the input and output matching networks to supply DC bias to the respective base and collector terminals of the amplifier transistor. The matching networks may be configured using only lumped inductive and capacitive elements, with values limited to less than about 10 nH and 10 pF, respectively, in order to facilitate monolithic integration with the bipolar transistor. Resistive elements are eliminated from the matching networks in order to further improve the noise figure performance of the amplifier. This illustrative embodiment of the invention has been demonstrated to provide a minimum gain of about 15 dB and a maximum noise figure of about 2 dB over 100 MHz-wide bands centered at 900 MHz and 1.8 GHz.

A low-noise amplifier in accordance with the present invention may be operated with bias supply voltages on the order of 1 to 1.5 volts, which can be easily derived from a single chemical battery in a handset or other portable communication terminal. The use of a single set of elements to provide narrowband input or output matches at two frequencies considerably simplifies the amplifier, while improving its performance. The matching network elements may be configured with limited values so as to facilitate integration. Moreover, the dual usage of various elements of the matching networks for both matching functions as well as other functions such as DC bias and isolation provides significant reductions in the size and complexity of the low-noise amplifier. These and other features and advantages of the present invention will become more apparent from the accompanying drawings and the following detailed description.

DETAILED DESCRIPTION OF THE INVENTION

The present invention will be illustrated below in conjunction with an exemplary low-noise amplifier for use in a personal communications service (PCS) system operating in two approximately 100 MHz-wide frequency bands, one centered at about 900 MHz and the other centered at about 1.8 GHz. It should be understood, however, that the invention is not limited to use with any particular amplifier type, set of frequency bands or communication system, but is instead more generally applicable to any multi-band wireless application in which it is desirable to reduce the complexity and cost of the radio frequency (RF) circuitry in a receiver front end. For example, the invention is suitable for use in mobile station receivers of the PCS systems described in greater detail in TIA/EIA/IS-95A, "Mobile Station—Base Station Compatibility for Dual-Mode Wideband Spread Spectrum Cellular System," June 1996, TIA/EIA/IS-97A, "Recommended Minimum Performance Standards for Base Station Supporting Dual-Mode Wideband Spread Spectrum Cellular Mobile Stations," June 1996, TIA/EIA/IS-98A, "Recommended Minimum Performance Standards for Dual-Mode Wideband Spread Spectrum Cellular Mobile Stations," June 1996, and ANSI J-STD-008, "Personal Station—Base Station Compatibility Requirements for 1.8 to 2.0 GHz Code Division Multiple Access (CDMA) Personal Communication Systems," all of which are incorporated by reference herein. The term "narrowband match" as used herein refers to a match which provides a desired gain, noise figure or other performance measure over one band of an amplifier operating in two or more bands, while suppressing gain between the bands. A narrowband match is thus in contrast to a broadband match, in which a relatively high gain is provided over two or more distinct operating bands without significantly suppressing gain between the bands.

Figure 1:
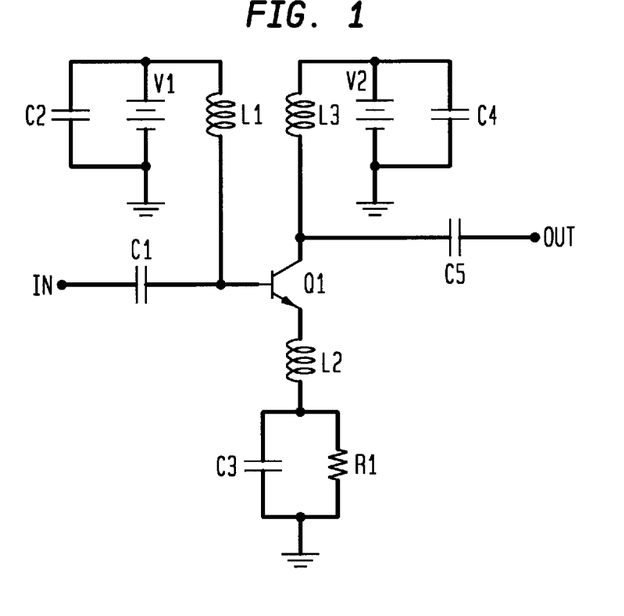
FIG. 1 illustrates exemplary DC biasing of a low-noise amplifier in accordance with the invention.

FIG. 1 illustrates techniques which may be used to bias an exemplary single-stage low-noise amplifier in accordance with the invention. The low-noise amplifier is shown without input and output matching networks in FIG. 1 in order to better illustrate the bias conditions. Suitable input and output matching networks will be described in conjunction with FIG. 5 below. The low-noise amplifier includes a single amplification stage comprising in this example an n-p-n bipolar junction transistor Q1. The transistor Q1 may be an HP Avantek 1400 bipolar junction transistor configured in a chip package. The transistor Q1 in this example was selected to have a gain-bandwidth frequency $f_T$ of only about 10 GHz. The gain-bandwidth frequency $f_T$ is the frequency at which the short-circuit gain $|h_{f_e}(\omega)|$ of the transistor Q1 approximates unity, as described in greater detail in, for example, G. Gonzalez, "Microwave Transistor Amplifiers, Analysis and Design," Prentice-Hall, Englewood Cliffs, N.J., 1984. Other suitable transistors, including but not limited to p-n-p bipolar junction transistors, field effect transistors (FETs) and high electron mobility transistors (HEMTs), could also be used for transistor Q1 in alternative embodiments of the single-stage low-noise amplifier shown in FIG. 1.

The FIG. 1 amplifier includes an input series capacitor C1 connected between an input terminal IN of the amplifier and the base terminal of transistor Q1. The capacitor C1 serves as a direct current (DC) isolation capacitor, which approximates an open circuit at DC and a short circuit at RF frequencies. The base of Q1 is connected via an inductor L1 to a voltage supply V1. A capacitor C2 is connected in parallel with the voltage supply V1 in order to reduce the supply line noise. The emitter of Q1 is connected to ground potential via an inductor L2 and a parallel combination of an emitter biasing resistor R1 and a capacitor C3. The inductor L2 provides feedback for improved RF matching, and also serves to reduce instabilities. The value of inductor L2 should be carefully selected so as to avoid degrading the RF gain of the amplifier, and may have a value on the order of about 0.2 nH. It should be noted that values of L2 greater than about 0.4 nH may cause an additional roll-off in the maximum available transistor gain starting below 1.8 GHz.

The capacitor C3 serves as a bypass capacitor, to shunt the emitter of Q1 to ground potential at RF frequencies such that the emitter biasing resistor R1 will not degrade the high-frequency transistor gain. The collector of Q1 is connected via an inductor L3 to a voltage supply V2. A capacitor C4 is connected in parallel with the voltage supply V2 in order to reduce the supply line noise. An output DC blocking capacitor C5 is connected between the collector of transistor Q1 and an output terminal OUT of the amplifier. The supply filter capacitors C2 and C4 may have values on the order of 100 pF. The capacitors C1 and C5 and inductors L1 and L3 in this embodiment will become part of the input or output matching networks, and suitable values for these elements will be described in conjunction with FIG. 5 below. The inductors L1 and L3 also provide RF choke functions, and approximate short circuits at DC and open circuits at RF frequencies.

The low-noise amplifier of FIG. 1 is configured in this illustrative embodiment to operate with V1 and V2 supply voltages of 1 volt and 1.5 volts, respectively. These values are selected to demonstrate that the amplifier can be operated reliably in two frequency bands using supplies derived from a single chemical battery in a handset or other portable communication terminal. The V1 supply voltage of 1 volt is used to bias the base of Q1, while the V2 supply voltage of 1.5 volts is used to bias the collector of Q1. The base-to-emitter voltage drop is approximately 0.7 volts, such that the emitter voltage is about 0.3 volts. Selecting the emitter biasing resistor R1 to have a value of about 60 Ω thus provides a collector current of about 5 mA. The total DC power consumption in the low-noise amplifier of FIG. 1 is approximately the collector current times the collector voltage, or about 7.5 mW. It should be noted that these biasing conditions are only exemplary, and other suitable arrangements could also be used. However, it has been observed that reducing the collector current to about 2 mA in this illustrative embodiment may reduce the amount of gain available in the 1.8 GHz frequency band. The bias conditions selected in a given embodiment will of course depend on factors such as the frequency bands and the characteristics of transistor Q1.

Figure 2:
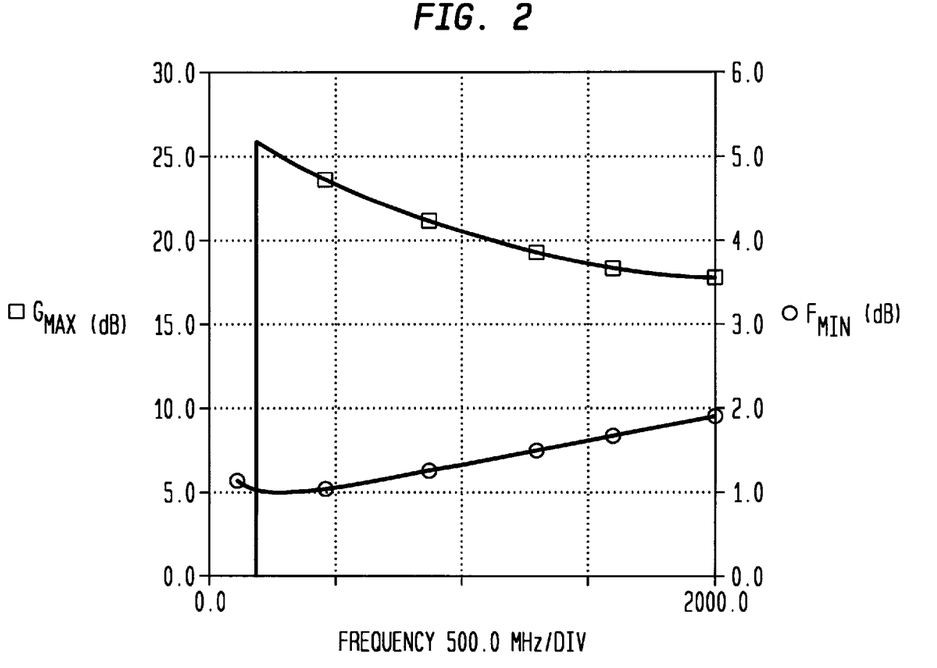
FIG. 2 shows plots of the maximum available gain and minimum noise figure of a low-noise amplifier biased as described in conjunction with FIG. 1.

FIG. 2 shows plots of maximum available gain $G_{max}$ and minimum noise figure $F_{min}$ as a function of frequency for the transistor Q1 biased in the manner described above. The plots indicate that about 21 dB of gain is available at 900 MHz, with a minimum noise figure of about 1.3 dB. However, only about 18 dB of gain is available at 1.8 GHz, with a minimum noise figure only slightly below 2.0 dB. Only a relatively small amount of mismatch can therefore be tolerated in the 1.8 GHz band of the low-noise amplifier of FIG. 1 if reasonably good performance measures, such as 15 dB gain and 2.0 dB noise figure, are to be achieved in both the 900 MHz and 1.8 GHz frequency bands. It will be shown in conjunction with FIGS. 5 through 10 below that input and output matching networks configured in accordance with the present invention are able to provide a minimum gain of 15 dB and a maximum noise figure of 2 dB over both the 900 MHz and 1.8 GHz frequency bands.

Figure 3:
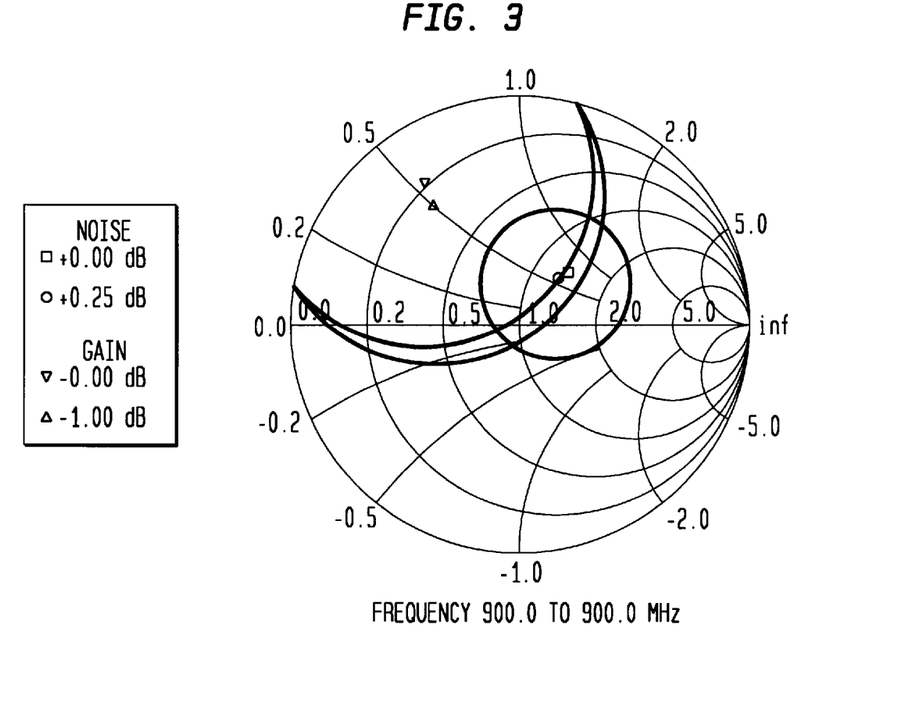
FIGS. 3 and 4 show plots of gain and noise circles at 900 MHz and 1.8 GHz, respectively, for a low-noise amplifier biased as described in conjunction with FIG. 1.
Figure 4:
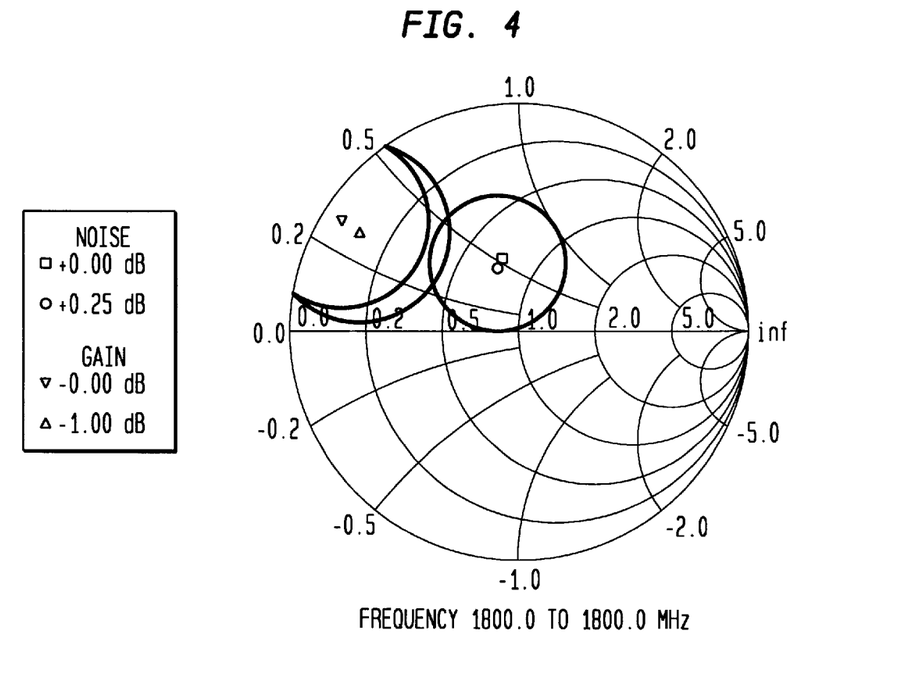

FIGS. 3 and 4 show noise and gain circles at 900 MHz and 1.8 GHz, respectively, for the transistor Q1 biased in the manner described above. As noted above, the noise figure at 1.8 GHz is the parameter which provides the least margin in this example. This parameter therefore places the most stringent demands on the input matching network, followed by the gain at 1.8 GHz and then the noise and gain at 900 MHz. Further constraints are placed on the input and output matching networks in accordance with the invention in order to suppress the gain outside these frequency bands.

Figure 5:
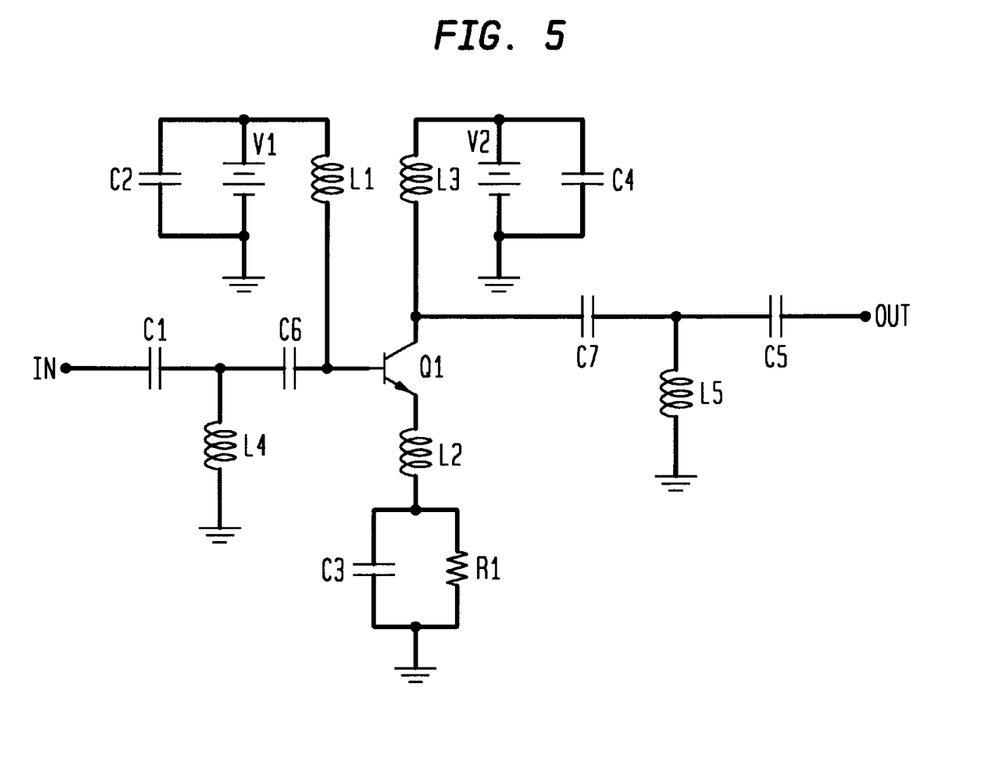
FIG. 5 is a schematic diagram illustrating the low-noise amplifier of FIG. 1 with input and output matching networks in accordance with the invention.

FIG. 5 shows the low-noise amplifier of FIG. 1 with illustrative input and output matching networks in accordance with the invention. These matching networks each utilize a set of four elements to provide narrowband matches for both the 900 MHz and 1.8 GHz frequency bands. Conventional matching techniques, in contrast, generally either utilize separate sets of two or three elements to provide a match for each frequency band, or attempt to provide a wideband match which covers both frequency bands. These conventional approaches not only fail to provide acceptable gain and noise figure performance in many important applications, but can also increase the size, complexity and cost of the low-noise amplifier. The present invention can provide a narrowband match for two frequency bands utilizing a single set of elements, thereby improving the amplifier performance while reducing its cost and complexity.

The input and output matching networks in this embodiment are designed to include inductors and capacitors having relative small values. For example, the inductors of the matching networks may all be less than or equal to about 10 nH, while the capacitors of the matching networks may all be less than or equal to about 10 pF. These elements are preferably configured as lumped elements rather than distributed elements, in order to facilitate monolithic integration of these elements with the bipolar transistor Q1. Although it may be easier in some applications to build the matching networks with distributed transmission line elements, it should be noted that the use of such elements may unduly increase the size of the amplifier circuit. For example, a quarter wavelength transmission line at 900 MHz would have a physical length on the order of 2 to 4 cm, and may therefore be impractical to use in a cellular handset. In accordance with another aspect of the invention, the illustrative matching networks do not utilize resistors because resistors have been found to contribute to the noise figure.

The low-noise amplifier of FIG. 5 utilizes four elements for each of the input and output matching networks. The input matching network includes capacitors C1 and C6, and inductors L1 and L4. The output matching network includes capacitors C5 and C7, and inductors L3 and L5. This embodiment utilizes a set of four elements for the matching networks of both input and output because two frequencies need to be matched. In terms of the Smith chart, moving from the 50 Ω center of the chart to any other impedance point on the chart generally requires a minimum of two degrees of freedom. These two degrees of freedom can be provided using a capacitor and an inductor at a given frequency. Matching at two different frequencies generally requires four degrees of freedom. The illustrative input and output matching networks in the low-noise amplifier of FIG. 5 each utilize two inductors and two capacitors to provide four degrees of freedom.

In order to reduce the total number of elements required in the FIG. 5 low-noise amplifier, the DC bias for the base of Q1 is provided through inductor L1 of the input matching network, the DC bias for the collector of Q1 is provided through inductor L3 of the output matching network, DC isolation for the amplifier input is provided using capacitor C1 of the input matching network, and DC isolation for the amplifier output is provided using capacitor C5 of the output matching network. This dual usage of various matching network elements provides further reductions in the size and complexity of the low-noise amplifier. The input matching network topology in the low-noise amplifier of FIG. 5 may therefore be summarized as follows:

| Source resistance | Series C (C1) for DC isolation | Shunt L (L4) to ground | Series C (C6) | Shunt L (L1) to DC supply V1 | Base of transistor Q1 |
|---|---|---|---|---|---|

The output matching network topology in the low-noise amplifier of FIG. 5 is summarized as follows:

| Load resistance | Series C (C5) for DC isolation | Shunt L (L5) to ground | Series C (C7) | Shunt L (L3) to DC supply V2 | Collector of transistor Q1 |
|---|---|---|---|---|---|

The input and output matching networks thus each utilize four elements to provide narrowband matches at 900 MHz and 1.8 GHz, with certain elements of the matching networks also serving DC isolation and bias functions.

The input and output matching networks of the low-noise amplifier of FIG. 5 may be optimized in accordance with a particular set of design goals using optimization tools such as an optimization function available in software packages from EESOF or MMICAD. An exemplary optimization of the FIG. 5 low-noise amplifier for operation in the 900 MHz and 1.8 GHz frequency bands will be given below. The design goals for this exemplary optimization are as follows:

| Frequency | Design Goal |
|---|---|
| 500 to 800 MHz | Gain < 10 dB |
| | Noise Figure < 3 dB |
| 850 to 950 MHz | 15 dB < Gain < 16 db |
| | Noise Figure < 2 dB |
| 1100 to 1500 MHz | Gain < 10 dB |
| 1750 to 1850 MHz | Gain ≧ 15 dB |
| | Noise Figure < 2 dB |

An embodiment of the FIG. 5 low-noise amplifier optimized for the design goals given above had the following lumped element values in the input and output matching networks:

Input Matching Network

| Element | Value | Z or Y at 900 MHz | Z or Y at 1.8 GHz |
| --- | --- | --- | --- |
| C1 | 9.07 pF | Z = −j 0.39 | Z = −j 0.20 |
| C6 | 3.69 pF | Z = −j 0.96 | Z = −j 0.48 |
| L1 | 7.60 nH | Y = −j 1.16 | Y = −j 0.58 |
| L4 | 4.79 nH | Y = −j 1.84 | Y = −j 0.92 |

Output Matching Network

| Element | Value | Z or Y at 900 MHz | Z or Y at 1.8 GHz |
| --- | --- | --- | --- |
| C5 | 0.80 pF | Z = −j 4.42 | Z = −j 2.21 |
| C7 | 1.46 pF | Z = −j 2.53 | Z = −j 1.26 |
| L3 | 8.16 nH | Y = −j 1.05 | Y = −j 0.52 |
| L5 | 10.0 nH | Y = −j 0.88 | Y = −j 0.44 |

As noted previously, all inductors and capacitors in this illustrative embodiment were limited to values less than or equal to 10 nH and 10 pF, respectively, in order to facilitate possible monolithic integration with the bipolar transistor Q1. The above table gives the impedance (Z) values for the matching network capacitors and the admittance (Y) values for the matching network inductors, at both 900 MHz and 1.8 GHz. The impedance and admittance values, normalized to 50 ω, were computed in accordance with the following equations:

$$Z = \frac{1}{j\omega C} = -j\frac{1}{0.314 f \text{ (GHz) } C \text{ (pF)}}$$

$$Y = \frac{1}{j\omega L} = -j\frac{1}{0.126 f \text{ (GHz) } L \text{ (nH)}}$$

where ω is the angular frequency, C and L are the capacitance and inductance values, respectively, and Z and Y are the impedance of the series capacitance and the admittance of the parallel inductance, respectively. The other elements C2, C3, C4, L2 and R1 of the low-noise amplifier of FIG. 5 had the values given previously in the bias circuit description above. That is, C2, C3 and C4 had values of about 100 pF, L2 had a value of about 0.20 nH, and R1 had a value of 60 Ω. It should again be emphasized that the above values are for a particular illustrative embodiment, and should not be construed as limiting the invention to any particular embodiment or class of embodiments. The values selected in a given application will depend on the particular design goals, the particular configuration of the matching networks, the type of transistor used as well as other factors.

Figure 6:
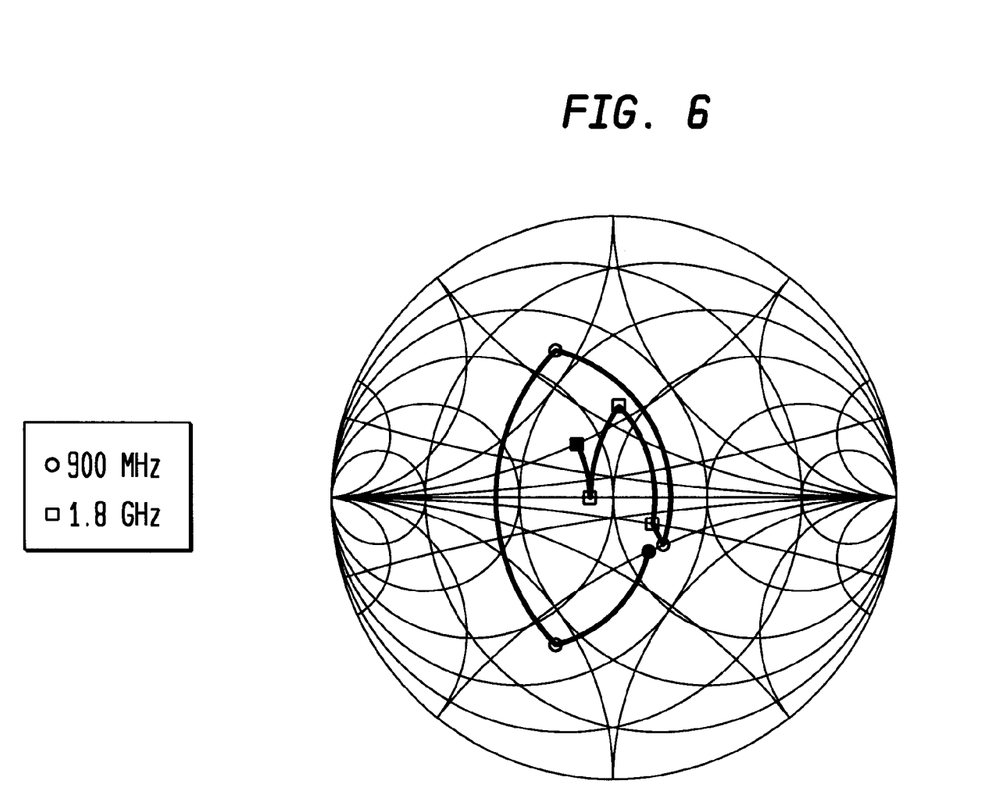
FIG. 6 shows Smith chart plots of the input reflection coefficients of the input and output matching networks of the low-noise amplifier of FIG. 5.

FIG. 6 shows a Smith chart plot of the input and output impedances of the low-noise amplifier of FIG. 5 at both 900 MHz and 1.8 GHz using the illustrative element values and bias conditions given above. It can be seen from the Smith chart plot that the input reflection coefficient $\Gamma_S$ at 1.8 GHz is very close to the locations indicated from the analysis of the bias conditions in conjunction with FIGS. 1 and 4 above. This is due in part to the stringent impedance matching requirements imposed by the small margin of mismatch at 1.8 GHz in the illustrative embodiment. At 900 MHz, the input reflection coefficient Γ is far from the locations indicated by the bias analysis. This is a result of the relatively large margin of mismatch at 900 MHz and the need to satisfy other criteria such as suppressing gain outside the 900 MHz and 1.8 GHz bands.

Figure 7:
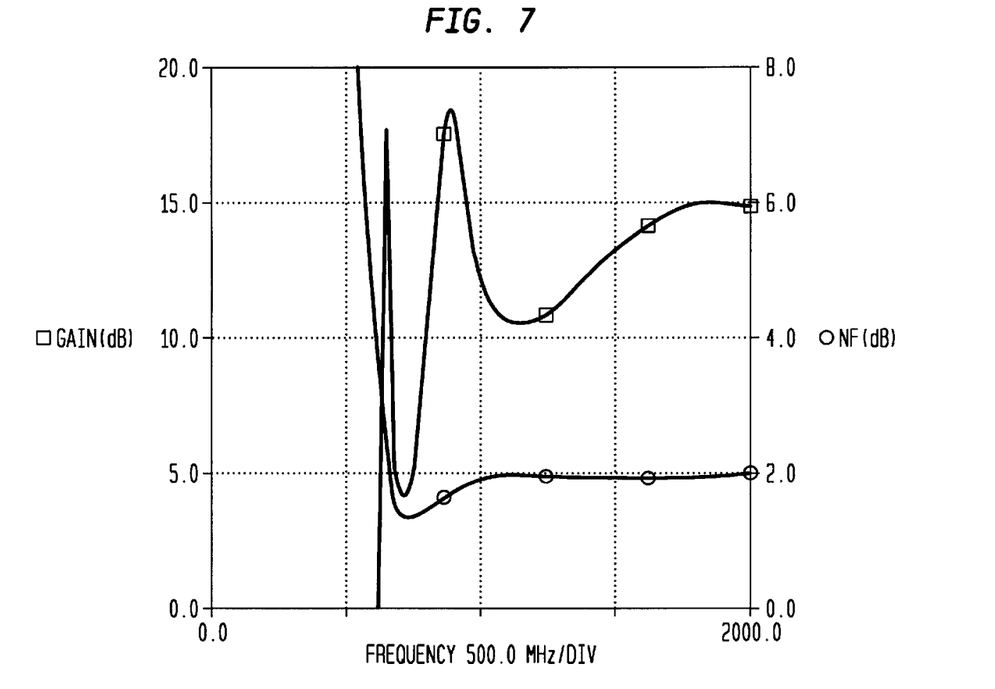
FIG. 7 shows plots of gain and noise figure of the low-noise amplifier of FIG. 5 from 100 MHz to 2.0 GHz.

FIG. 7 shows the broadband gain and noise figure performance from 100 MHz to 2.0 GHz of the illustrative low-noise amplifier described above. It can be seen from FIG. 7 that the gain is about 18 dB in the 900 MHz band and about 15 dB in the 1.8 GHz band, while the noise figure is 2 dB or less in both bands. In addition, the gain is suppressed to below about 12 dB between the two bands. The illustrative low-noise amplifier has therefore met the primary design criteria set forth above. It can also be seen from FIG. 7 that below about 700 MHz the amplifier gain drops sharply to below 0 dB while the noise figure rises to above 20 dB. The resulting increased noise will therefore not be amplified significantly and may be filtered out in later receiver stages. It should be noted that the gain response in this example exhibits a very narrow resonance at around 700 MHz having a gain of more than 15 dB. Further adjustments may be made in the exemplary matching network element values given above in order to eliminate this resonance. It should be noted that sensitivity analysis performed by varying the lumped element values indicates that the matching networks are not overly sensitive to process variations.

Figure 8:
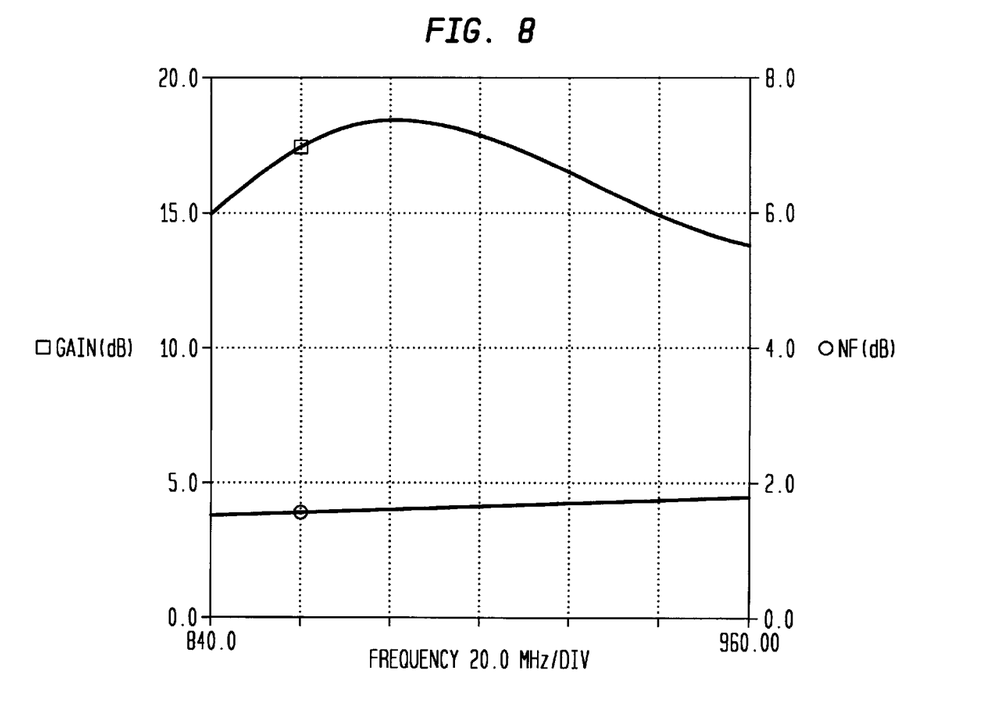
FIG. 8 shows plots of gain and noise figure of the low-noise amplifier of FIG. 5 in a 120 MHz-wide frequency band centered at 900 MHz.
Figure 9:
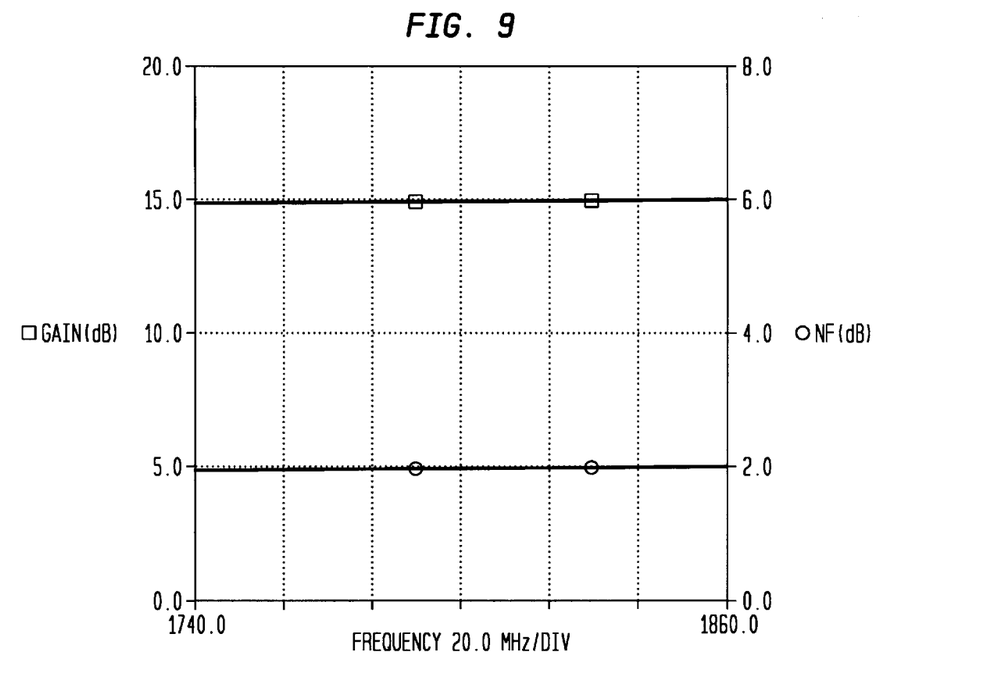
FIG. 9 shows plots of gain and noise figure of the low-noise amplifier of FIG. 5 in a 120 MHz-wide frequency band centered at 1.8 GHz.

FIGS. 8 and 9 show narrowband gain and noise figure plots for the exemplary low-noise amplifier in the frequency bands of 840 to 960 MHz and 1.74 to 1.86 GHz, respectively. It can be seen more clearly in FIGS. 8 and 9 that the gain is greater than about 15 dB and the noise figure is less than about 2 dB across 100 MHz bands centered at 900 MHz and 1.8 GHz.

Figure 10:
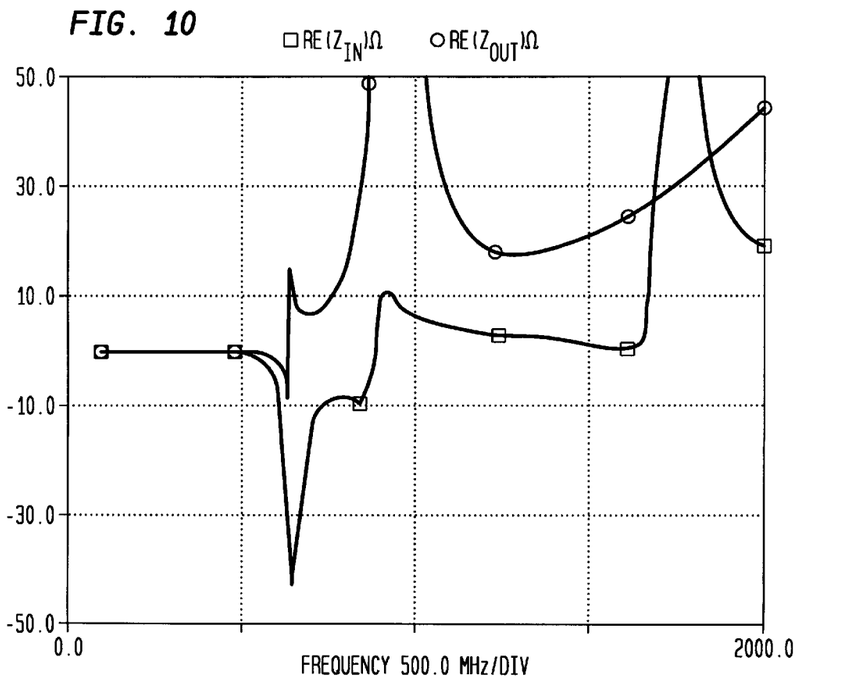
FIG. 10 shows the real part of the input and output impedance of the low-noise amplifier of FIG. 5 from 100 MHz to 2.0 GHz.

FIG. 10 shows the real parts of the input impedance $Z_{IN}$ and the output impedance $Z_{OUT}$ of the exemplary low-noise amplifier from about 100 MHz to 2.0 GHz. The stability factors of the illustrative amplifier do not guarantee unconditional stability. Therefore, instability leading to oscillation may result if the input and the output are improperly matched. Although stability is generally a significant concern in the design of any low-noise amplifier, the presence of resonances may make stability even more important in the design of a dual-band low-noise amplifier. The usual condition for stability is that the real part of the input and output impedance should be less than the negative of the respective source and load resistance, which is assumed to be 50 Ω in this example. If the real part of the input or output impedance is negative and is greater in magnitude than the corresponding source or load resistance, a net negative resistance results and oscillations may begin. Therefore, the real part of the input and output impedances in this example should be greater than a −50 Ω limit. It can be seen from FIG. 10 that the real parts of the input and output impedances of the illustrative low-noise amplifier are greater than −50 Ω and the amplifier therefore exhibits stable operation across the 900 MHz and 1.8 GHz frequency bands. Further adjustment of the matching network element values may be undertaken in order to reduce or eliminate the 700 MHz resonance in the illustrative embodiment and thereby improve the stability margin.

A low-noise amplifier configured in accordance with the invention utilizes a single set of input matching elements and a single set of output matching elements to provide narrowband input and output matches at two frequencies, thereby allowing the amplifier to operate in two distinct frequency bands. The illustrative embodiment described above can provide a minimum 15 dB gain and a maximum 2 dB noise figure across both a 900 MHz band and a 1.8 GHz band, with gain suppression outside of these bands except for a slight resonance at 700 MHz. The illustrative embodiment utilizes a four-element input matching network and a four-element output matching network. An inductive element of each of input and output matching networks is used to bias the amplifier transistor, while a capacitive element of each of the input and output matching networks is used to provide DC isolation. Although potential instabilities can arise in the illustrative embodiment, particularly at the 700 MHz resonance, such instabilities can be controlled using conventional techniques. Alternative embodiments of the invention may utilize more than a single amplification stage, or other arrangements of elements in the input and output matching networks in order to provide two or more narrowband matches for the amplifier.

Figure 11:
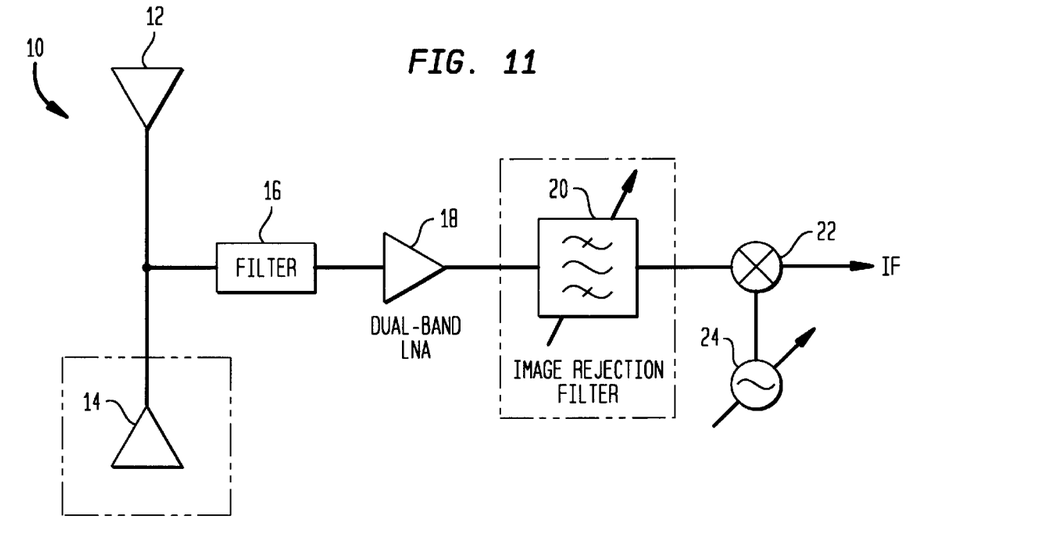
FIGS. 11 and 12 show exemplary receivers configured in accordance with the invention.
Figure 12:
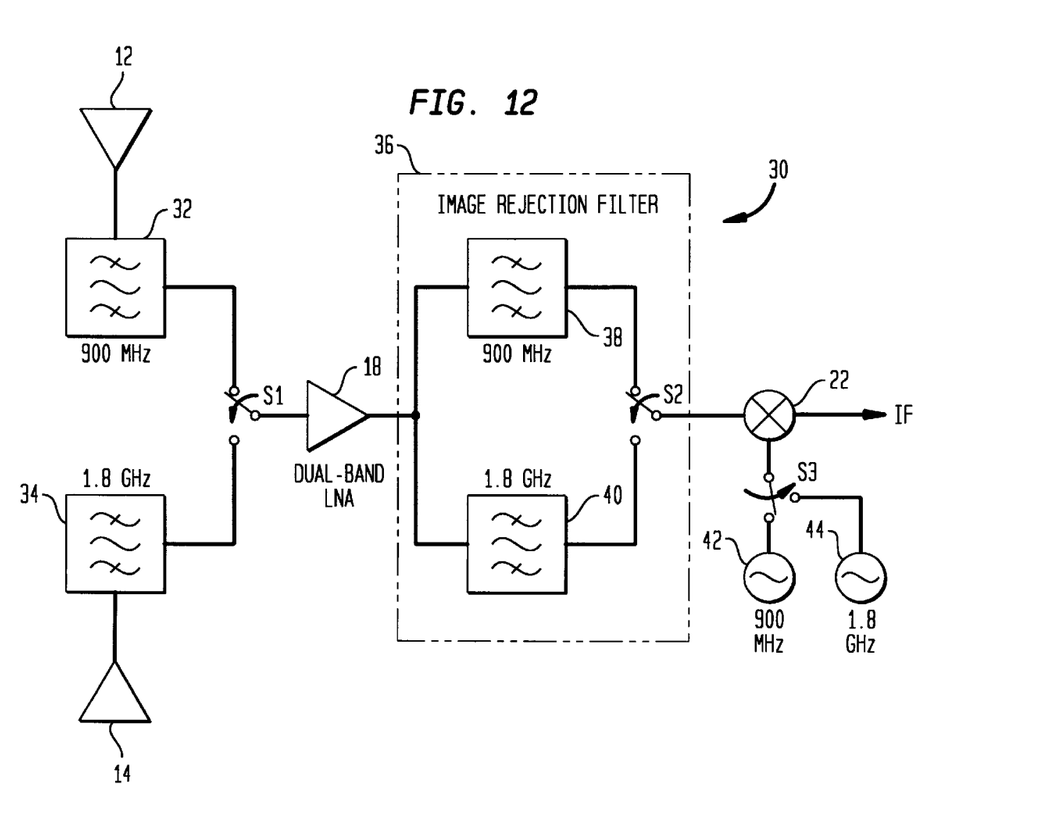

FIGS. 11 and 12 illustrate exemplary receivers in accordance with the invention. FIG. 11 shows a receiver 10 which includes a first antenna 12 and a second antenna 14. The first antenna 12 may be designed to receive an RF signal in a first frequency band, such as the above-described 900 MHz frequency band, while the second antenna 14 may be designed to receive an RF signal in a second frequency band, such as the above-described 1.8 GHz frequency band. Elements shown in dashed boxes in FIGS. 11 and 12 are optional elements which may be eliminated in alternative embodiments. For example, the second antenna 14 may be eliminated in the receiver 10, and the first antenna 12 used to receive RF signals in two different frequency bands. The outputs of the antennas 12, 14 are filtered in a filter 16 and then applied to an input of a dual-band low-noise amplifier 18. The amplifier 18 may be of the type described in conjunction with FIG. 5 above, or another suitable dual-band low-noise amplifier in accordance with the invention. The filter 16 may be implemented as a variable band-pass filter which is capable of being adjusted to provide band-pass filtering of both the 900 MHz and the 1.8 GHz frequency bands, or a filter which can pass both bands simultaneously without adjustment. The output of the low-noise amplifier 18 is applied to an optional image rejection filter 20 which in this example is implemented as a variable band-pass filter. The variable band-pass filter can be adjusted to pass either the 900 MHz band or the 1.8 GHz band. The image rejection filter 20 may be eliminated in alternative embodiments. The output of the filter 20 is applied to a mixer 22. The mixer 22 uses an appropriate local oscillator signal supplied by a frequency synthesizer 24 to downconvert an RF signal received by antenna 12 or 14 to an intermediate frequency (IF) signal. The local oscillator signal frequency varies depending on whether an RF signal from the 900 MHz band or the 1.8 GHz band is being downconverted, such that the output IF signal may have the same center frequency in either case. The receiver 10 is thus able to receive and downconvert to IF an input signal in one of two different frequency bands, using only a single low-noise amplifier.

FIG. 12 shows a receiver 30 in accordance with an alternative embodiment of the invention. The receiver 30 includes the first and second antennas 12, 14, the dual-band low-noise amplifier 18, and the mixer 22, all of which operate in a manner similar to that described in conjunction with FIG. 11 above. The receiver 30 also includes separate bandpass filters 32, 34 for filtering RF signals received on the respective antennas 12, 14 in the respective 900 MHz and 1.8 GHz frequency bands. A first switch S1 selects the output of one of the filters 32, 34 for application to the input of the dual-band low-noise amplifier 18. The output of the amplifier 18 is supplied to an optional image rejection filter 36 which includes first and second bandpass filters 38, 40 for filtering in the 900 MHz and 1.8 GHz bands, respectively. A second switch S2 selects the output of one of the filters 38, 40 for application to an RF input of the mixer 22. The local oscillator input of the mixer 22 receives the output of a local oscillator 42 for the 900 MHz band or the output of a local oscillator 44 for the 1.8 GHz band, depending on the position of a third switch S3. The receiver 30, like the receiver 10 of FIG. 11, is thus able to receive and downconvert to IF an input signal in one of two different frequency bands, using only a single dual-band low-noise amplifier. It should be noted that dual-band low-noise amplifiers in accordance with the invention may be incorporated into a wide variety of other types of receivers.

The above-described embodiments of the invention are intended to be illustrative only. Numerous alternative embodiments may be devised by those skilled in the art without departing from the scope of the following claims.

What is claimed is:

1. A low-noise amplifier comprising:
    an amplification stage for amplifying a signal applied to an input of the amplifier; and
    an input matching network coupled between the input of the amplifier and an input of the amplification stage, the input matching network using a set of elements to provide a match in a first frequency band, and at least a subset of the set of elements to provide a match in a second frequency band, wherein the set of elements includes a first capacitor and a second capacitor connected in series between the amplifier input and the amplification stage input, a first inductor connected from a point between the first and second capacitors to a first circuit potential of the amplifier, and a second inductor connected from the amplification stage input to a second circuit potential of the amplifier.

2. The amplifier of claim 1 wherein the low-noise amplifier includes only a single amplification stage comprising a single bipolar junction transistor.

3. The amplifier of claim 1 wherein the first frequency band is centered at about 900 MHz, and the second frequency band is centered at about 1.8 GHz.

4. The amplifier of claim 1 wherein at least one of the elements in the set of elements of the input matching network is configured to provide DC isolation for the input of the amplifier.

5. The amplifier of claim 1 wherein at least one of the elements in the set of elements of the input matching network is configured to supply a DC bias voltage to the amplification stage.

6. The amplifier of claim 1 wherein the set of elements includes only lumped inductive and capacitive elements.

7. The amplifier of claim 1 wherein any inductive elements in the set of elements have inductance values less than or equal to about 10 nH.

8. The amplifier of claim 1 wherein any capacitive elements in the set of elements have capacitance values less than or equal to about 10 pF.

9. The amplifier of claim 1 further providing a gain of at least about 15 dB in each of the first and the second frequency bands.

10. The amplifier of claim 1 further providing a noise figure of about 2 dB or less in each of the first and the second frequency bands.

11. The amplifier of claim 1 wherein the first inductor is connected from a point between the first and second capacitors to ground potential, and the second inductor is connected from the amplification stage input to a voltage supply of the amplifier.

12. The amplifier of claim 1 further including an output matching network coupled between an output of the amplification stage and an output of the amplifier, the output matching network using a second set of elements to provide a match in the first frequency band, and at least a subset of the second set of elements to provide a match in the second frequency band.

13. The amplifier of claim 12 wherein the output matching network includes a first capacitor and a second capacitor connected in series between the amplifier output and the amplification stage output, a first inductor connected from a point between the first and second capacitors to ground potential, and a second inductor connected from the amplification stage output to a voltage supply of the amplifier.

14. The amplifier of claim 12 wherein at least one of the elements in the second set of elements of the output matching network is configured to provide DC isolation for the output of the amplifier.

15. The amplifier of claim 12 wherein at least one of the elements in the second set of elements of the output matching network is configured to supply a DC bias voltage to the amplification stage.

16. A method of operating a low-noise amplifier in multiple frequency bands, the method comprising the steps of:
amplifying a signal applied to an input of the amplifier in an amplification stage; and
utilizing a set of elements of an input matching network to provide an input match for the amplifier in a first frequency band, the set of elements including a first capacitor and a second capacitor connected in series between the amplifier input and an input of the amplification stage, a first inductor connected from a point between the first and second capacitors to a first circuit potential of the amplifier, and a second inductor connected from the amplification stage input to a second circuit potential of the amplifier; and
utilizing at least a subset of the set of elements to provide an input match for the amplifier in a second frequency band.

17. The method of claim 16 wherein the first frequency band is centered at about 900 MHz, and the second frequency band is centered at about 1.8 GHz.

18. The method of claim 16 further including the step of utilizing at least one of the elements in the set of elements of the input matching network to provide DC isolation for the input of the amplifier.

19. The method of claim 16 further including the step of utilizing at least one of the elements in the set of elements of the input matching network to supply a DC bias voltage to the amplification stage.

20. The method of claim 16 wherein the set of elements includes only lumped inductive and capacitive elements.

21. The method of claim 16 further including the steps of:
utilizing a second set of elements of an output matching network to provide an output match for the amplifier in the first frequency band; and
utilizing at least a subset of the second set of elements to provide an output match for the amplifier in the second frequency band.

22. The method of claim 21 further including the step of utilizing at least one of the elements in the second set of elements of the output matching network to provide DC isolation for the output of the amplifier.

23. The method of claim 21 further including the step of utilizing at least one of the elements in the second set of elements of the output matching network to supply a DC bias voltage to the amplification stage.

24. A low-noise amplifier comprising:
an amplification stage for amplifying a signal applied to an input of the amplifier;
an input matching network coupled between the input of the amplifier and an input of the amplification stage; and
an output matching network coupled between an output of the amplification stage and an output of the amplifier, wherein at least one of the input matching network and the output matching network utilizes common elements of a single set of elements to provide narrowband matches in both a first frequency band and a second frequency band, the set of elements including a first capacitor and a second capacitor connected in series, a first inductor connected from a first point, between the first and second capacitors to a first circuit potential of the amplifier, and a second inductor connected from a second point, on a side of the first or second capacitor opposite the first point, to a second circuit potential of the amplifier.

25. A signal receiver comprising:
at least one antenna for receiving a signal in at least one of a first frequency band and a second frequency band;
a filter having an input coupled to an output of the at least one antenna, the filter providing filtering of the received signal in at least one of the first and second frequency bands;
a low-noise amplifier having an input coupled to an output of the filter, the amplifier amplifying the received signal applied to the amplifier input, the amplifier including an input matching network which uses a set of elements to provide a match in the first frequency band, and at least a subset of the set of elements to provide a match in the second frequency band the set of elements including a first capacitor and a second capacitor connected in series between the amplifier input and an input of an amplification stage, a first inductor connected from a point between the first and second-capacitors to a first circuit potential of the amplifier, and a second inductor connected from the amplification stage input to a second circuit potential of the amplifier; and
a signal converter having an input coupled to an output of the amplifier, the signal converter converting the received signal to an intermediate frequency.

26. The receiver of claim 25 wherein the first frequency band is centered at about 900 MHZ, and the second frequency band is centered at about 1.8 GHz.

27. The receiver of claim 25 further including an image rejection filter coupled between an output of the amplifier and an input of the signal converter.

28. The receiver of claim 25 wherein the filter includes a first filter providing band-pass filtering in the first frequency band, and a second filter providing band-pass filtering in the second frequency band.

29. The receiver of claim 28 further including a switch configured to connect an output of either the first filter or the second filter to an input of the amplifier.

30. The receiver of claim 28 further including a switch configured to connect a local oscillator input of the signal converter to an output of either a first local oscillator associated with the first frequency band or a second local oscillator associated with the second frequency band.

* * * * *